United States Patent
Gerlach et al.

(10) Patent No.: US 8,355,417 B2
(45) Date of Patent: Jan. 15, 2013

(54) VERTICAL CAVITY SURFACE EMITTING LASER WITH IMPROVED MODE-SELECTIVITY

(75) Inventors: Philipp H. Gerlach, Blaustein (DE); Michael Miller, Ulm (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 104 days.

(21) Appl. No.: 13/123,759

(22) PCT Filed: Oct. 7, 2009

(86) PCT No.: PCT/IB2009/054384
§ 371 (c)(1),
(2), (4) Date: Apr. 12, 2011

(87) PCT Pub. No.: WO2010/044010
PCT Pub. Date: Apr. 22, 2010

(65) Prior Publication Data
US 2011/0188531 A1    Aug. 4, 2011

(30) Foreign Application Priority Data
Oct. 14, 2008 (EP) .................................... 08166564

(51) Int. Cl.
*H01S 5/00* (2006.01)
(52) U.S. Cl. ............... 372/43.01; 372/45.01; 372/46.01; 372/50.11
(58) Field of Classification Search ............... 372/43.01, 372/45.01, 46.01
See application file for complete search history.

(56) References Cited

U.S. PATENT DOCUMENTS

| 5,568,499 | A | 10/1996 | Lear |
| 6,507,595 | B1 | 1/2003 | Kapon et al. |
| 6,549,556 | B1 | 4/2003 | Hwang et al. |
| 6,611,543 | B2 | 8/2003 | Hwang |
| 2007/0280320 | A1* | 12/2007 | Feezell et al. ............... 372/46.01 |
| 2008/0069166 | A1* | 3/2008 | Lee et al. ................... 372/50.11 |

OTHER PUBLICATIONS

McDaniel, M. et al., "Hybrid dielectrical/metal reflector for low threshold vertical-cavity surface-emitting lasers", 1997, pp. 1704-1705, vol. 33, No. 20.
Berseth C. et al., "Vertical cavity surface emitting lasers incorporating structured mirrors patterned by electron-beam lithography", 1999, pp. 3222-3225, vol. 17, No. 6.
Goosen K. et al., "On the use of tin oxide for metal-dielectric mirrors with strong adhesion", 1999, pp. 171-172, vol. 1.
Ortsiefer M. et al., "Room-temperature operation of index-guided 1.55 [micro]m InP-based vertical-cavity surface-emitting laser", 2000, pp. 437-439, vol. 36, No. 5.

* cited by examiner

*Primary Examiner* — Dung Nguyen

(57) ABSTRACT

It is an object of the invention to provide a VCSEL having both a high beam quality or a low $M^2$-factor, respectively, and a reduced mirror thickness which improves the heat dissipation due to the reduced thickness and the production cost. It is suggested to employ a Bragg-reflector in combination with a metal reflector terminating the distal side of the Bragg-reflector as seen from the laser cavity, wherein the metal reflector layer is localized at the center around the optical axis.

14 Claims, 3 Drawing Sheets

VERTICAL CAVITY SURFACE EMITTING LASER WITH IMPROVED MODE-SELECTIVITY

FIELD OF THE INVENTION

The invention generally relates to semiconductor laser diodes and more specifically to improvements of vertical cavity surface emitting lasers (VCSELs).

BACKGROUND OF THE INVENTION

Vertical-cavity surface-emitting lasers (VCSELs) are attractive devices for high-power applications. Since the output power and efficiency of VCSELs in CW-operation is usually limited by thermal effects, bottom-emitting VCSELs with an emission wavelength of around 980 nm are preferred for high-power applications. They are mounted p-side down in order to have the active area close to the heat sink and to avoid high thermal resistances. Nevertheless, bottom-emitting VCSELs required quite some distributed Bragg reflectors (DBRs) on the p-side of the VCSEL in order to achieve moderate threshold currents and to avoid outcoupling losses on the wrong facet. Since the number of p-DBRs determines the thermal performance, the design of bottom-emitting VCSELs for high-power applications usually needs a difficult compromise between optical performance and thermal management.

State-of-the-art vertical-cavity surface-emitting lasers that emit to the bottom (substrate) side require approximately 30 pairs of distributed Bragg reflectors (DBRs) on the p-side of the laser diode. If these devices are intended to be used in a high-power application, they are typically mounted p-side down and the number of p-DBRs defines the thermal resistance.

In the publication "Hybrid dielectric/metal reflector for low threshold vertical-cavity surface emitting lasers", M. R. Daniel et al, Electron. Lett. 1997 Vol. 33 No. 20, pp 1704 ff, a bottom emitting VCSEL is disclosed comprising a dielectric top mirror with a metallic overcoat to reduce the mirror thickness. However, coming along with the reduced mirror thickness, not only the bandwidth increases, as disclosed in the above mentioned publication, but also the amplification of a variety of modes. This on the other hand is detrimental for the beam quality.

SUMMARY OF THE INVENTION

It is therefore an object of the invention to provide a VCSEL having both a high beam quality or a low $M^2$-factor, respectively, and a reduced mirror thickness which improves the heat dissipation due to the reduced thickness and the production cost. This object is solved by the subject matter of claim 1. Advantageous embodiments and refinements are defined in the dependent claims.

It is suggested to employ a Bragg-reflector in combination with a metal reflector terminating the distal side of the Bragg-reflector as seen from the laser cavity, wherein the metal reflector layer is localised at the centre around the optical axis. This way, the reflectivity of the lowest optical mode, i.e. the $TEM_{00}$-mode is very high as the intensity of this mode has a Gaussian profile, whereas higher modes have intensity maximums radially offset to the centre axis of the cavity. Thus, the reflectivity is decreased for higher optical modes.

Accordingly, a vertical cavity surface emitting laser diode is provided, comprising a substrate and disposed thereon a first Bragg-reflector layer stack and second Bragg-reflector layer stack, which form a laser cavity with an optical axis along which a laser beam is emitted in operation. Typically, a p-n transition or one or more quantum wells are embedded between the two Bragg reflector layer stacks as light emitting elements. A metallic reflector layer optically terminates one of the Bragg-reflector layer stacks. The metallic reflector layer is localised about the optical axis and covers an area no larger than an area within which the intensity of the $TEM_{00}$-laser mode exceeds more than one third, preferably more than one half of its maximum intensity.

VCSELs for high quality beams often comprise a confinement layer which confines the flow of the electrical current and hence the lasing region in lateral direction. Here, independent of the lateral intensity distribution of the $TEM_{00}$-mode, a decrease of the reflectivity for higher optical modes can be achieved, if the area covered by the metallic reflector layer does not exceed the area of the current aperture of the confinement layer. Thus, according to a further, alternative or additional embodiment of the invention, a vertical cavity surface emitting laser diode is provided, comprising a substrate and disposed thereon a first Bragg-reflector layer stack and a second Bragg-reflector layer stack, which together form a laser cavity with an optical axis along which a laser beam is emitted in operation.

The metallic reflector layer according to this embodiment of the invention terminates one of the Bragg-reflector layer stacks and is localised about the optical axis. Further, a current confinement layer having a current aperture is provided which laterally confines the current flowing through the laser cavity, wherein the metallic reflector layer covers an area of a size which does not exceed the size of the area covered by the aperture.

To provide sufficient reflectivity for the $TEM_{00}$-mode, it is further advantageous if the area covered by the metallic reflector layer is at least 1/10 of the area covered by the aperture. In terms of the lateral intensity distribution of the $TEM_{00}$-mode, preferably the metallic reflector layer covers at least an area along which the $TEM_{00}$-mode as at least 3/4 of its maximum intensity.

It is further preferred to deposit the metallic reflector layer onto an insulating layer if the Bragg-reflector which is terminated by the metal reflector. The purpose of the insulating material is to hinder the metal of the reflector layer, such as in particular gold to diffuse into the semiconductor and to adjust the phase of the optical reflection of the insulator-metal interface to the standing wave pattern of the resonator. In this respect, a particularly suitable insulator is silicon oxide. Alternatively, other oxides such as, e.g. aluminium oxide may be employed.

To enhance the effect of mode-selectivity, the metallic reflection layer and/or the optional insulating layer may be suitably structured so that the reflectivity decreases from the optical axis towards the edge of the metallic reflection layer. A suitable structuring may in particular be a variation of the coverage, i.e. the ratio of surface regions covered by the layer to regions not covered. Thus, according to this refinement of the invention, the coverage by the metallic reflection layer gradually decreases from the coverage at the optical axis along a direction radially outwards.

Materials which are particularly suited for the metallic reflection layer are gold, silver, copper, and alloys thereof. The above listed metals have a real part of the refractive index of less than 0.5 at typical VCSEL laser wavelengths between 500 and 1000 nm. A low real part of the refractive index of the metal at the laser wavelength is generally preferred to provide a high refractive index difference and thus a high reflectivity at the interface to the adjacent layer.

According to a preferred embodiment of the invention, the VCSEL is a bottom emitting VCSEL and the metallic reflector layer is disposed on the topmost Bragg-reflector layer stack deposited on the substrate (i.e. the Bragg-reflector layer stack on the opposite side of the active layer as seen from the substrate). Particularly, if the metallic reflector layer is deposited onto an insulating layer, the electrical contact on the top of the VCSEL is accomplished by a separate metal layer. In particular, the electrical contact layer on top of the laser diode may circumferentially surround the metallic reflector layer. Thus, the electrical contact forms a ring contact which surrounds the metallic reflector layer. Advantageously, the ring contact and the metallic reflector layer may be at least partially separated by a gap. This way, light from inside the cavity predominantly coming from higher optical modes can pass through the gap.

However, it is also possible to use the metallic reflector layer as at least a part of one of the electrical contacts. For example, this is possible if an insulating layer between the Bragg-reflector and the metallic reflector layer is omitted.

If a ring contact surrounding the metallic reflector layer is employed, however, carriers are no longer injected in the centre of the mesa but slightly off. This might possibly be detrimental in particular for VCSELs with large active areas where the lateral conductivity becomes an issue. According to a refinement of the invention it is therefore suggested to produce an electrical contact layer contacting the Bragg-reflector layer stack which is terminated by the metallic reflector layer, wherein the electrical contact layer comprises sections which intersect with the metallic reflector layer. In particular, the intersection may be at or near the optical axis. For example, the p-contact might not only consist of a ring but also have some thin metal stripes going through the inner part of the mesa to improve carrier injection.

According to another embodiment, the VCSEL is a top emitting laser diode. In this case, the metallic reflector layer may be buried or embedded underneath the first and second Bragg-reflector layer stacks.

The localised metallic reflector layer both provides for an optical mode selectivity and an enhanced reflectivity. Due to the latter effect, the corresponding Bragg-reflector which is terminated by the metallic reflector layer may be considerably thinner, thereby reducing the production cost. Specifically, the Bragg-reflector layer stack terminated by the metallic reflector layer may comprise 15 or even less than 15 pairs of layers with alternating higher and lower refractive index.

DETAILED DESCRIPTION OF EMBODIMENTS

Figure 1:
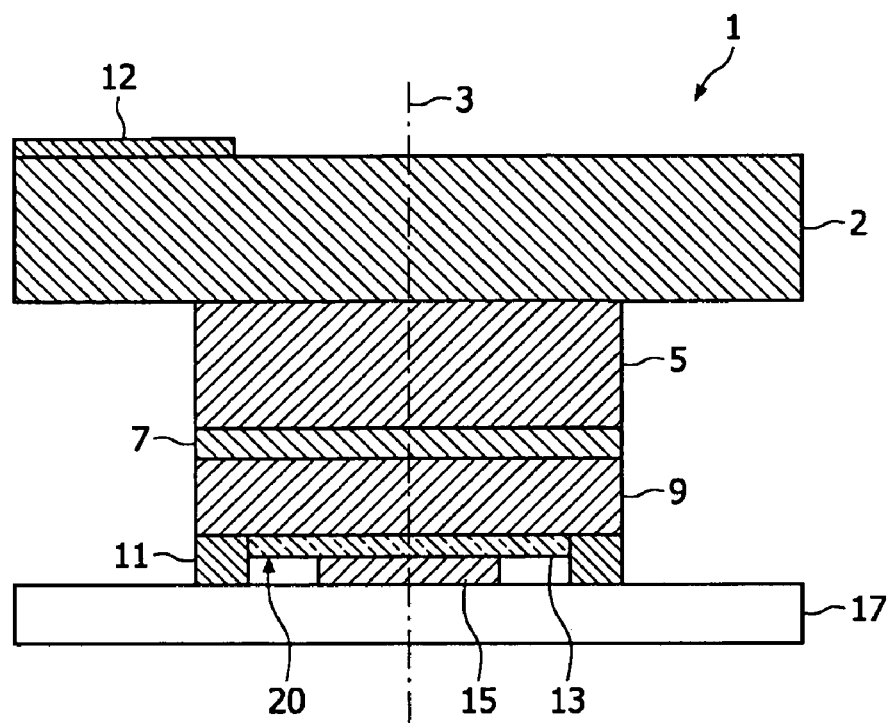
FIG. 1 shows a cross section of a first embodiment of the invention.

FIG. 1 shows a first embodiment of a VCSEL 1 according to the invention. The VCSEL 1 comprises a substrate 2 and disposed thereon a first distributed Bragg-reflector (DBR) comprising a first Bragg-reflector layer stack 5, a second distributed Bragg-reflector comprising a second Bragg-reflector layer stack 9, and an active region 7 between the first and second Bragg-reflector layer stacks 5, 9. The Bragg-reflector layer stacks 5, 9, or the DBRs, respectively, and the active region 7 together form a laser cavity. The optical axis 3 of the cavity is defined by the centre of the laser beam emitted in operation.

The embodiment shown in FIG. 1 is a bottom-emitting VCSEL, where the laser light generated in the cavity is partially transmitted through the Bragg-reflector layer stack 5 and the substrate 2. A preferred substrate material is gallium arsenide, GaAs. Typically, the first or bottom Bragg-reflector layer stack 5 comprises n-type distributed Bragg-reflector layers, whereas the second or top Bragg-reflector layer stack 7 comprises p-type layers. The Bragg-reflector layer stacks 5, 7 each comprise pairs of layers of different refractive indices. For example, a typical Bragg-reflector layer stack employed in VCSELs comprises stacked pairs of GaAs and AlGaAs.

The pump current is applied to the VCSEL via a bottom electrode 12 on the substrate 2, and a further top electrode 11 on top of Bragg-reflector layer stack 9. The top electrode is set up as a ring contact or ring electrode. An insulating layer 20 is arranged inside of the ring contact 11.

On this insulating layer 20, a metallic reflector layer 15 is deposited. The insulating layer 20 inhibits a diffusion of metal atoms from the metallic reflector layer 15 into the semiconductor layers of Bragg-reflector layer stack 9.

The metallic reflector layer 15 optically terminates the second Bragg-reflector layer stack 9 in that light which passes through this Bragg-reflector layer stack 9 is reflected back by layer 15. In particular, the metallic reflector layer 15 is localised at the optical axis 3, wherein the area covered by the layer 15 is smaller than the area in which the intensity of the $TEM_{00}$-laser mode exceeds more than one third of its maximum intensity, preferably more than one half of its maximum intensity. Further, an annular gap extends between the metallic reflector layer and the ring contact 11.

The metallic reflector layer has a high reflectivity for the laser light. In contrast thereto, the ring electrode is made from a material which provides low electrical losses at the interface to the semiconducting layers of the Bragg-reflector layer stack 9. In comparison to a conventional design, the p-type Bragg-reflector layer stack 9 terminated by the metallic reflector layer 15 requires considerably less pairs of layers with alternating refractive index to obtain a comparable reflectivity. Coming along therewith, also the thermal resistance is significantly improved. Generally, 15 pairs of layers with alternating refractive index such as GaAs/AlGaAs layer pairs are sufficient. For example, Bragg reflector layer stack 9 may comprise 10 pairs of GaAs/AlGaAs layers. In contrast thereto, Bragg-reflector layer stack 5 comprises 20 or more pairs, e.g. 30 pairs of alternating GaAs/AlGaAs layers.

In the embodiment of FIG. 1, a heat sink 17 is arranged on the mesa structure of the VCSEL 1. This heat sink 17 is both used to dissipate heat and to electrically connect the ring electrode 11.

Figure 2:
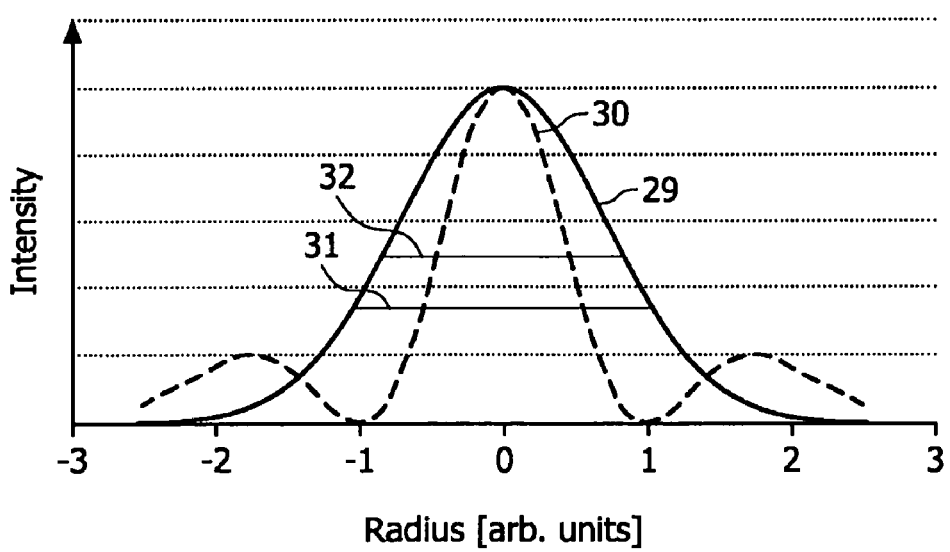
FIG. 2 shows the intensity distributions of the $TEM_{00}$ and $TEM_{10}$-modes in radial direction.

FIG. 2 shows a graph of the intensity distributions of the optical $TEM_{00}$ and $TEM_{10}$-modes in radial direction laterally to the optical axis. The $TEM_{00}$-mode has a Gaussian profile with its maximum at the optical axis, whereas the $TEM_{10}$-mode has a further maximum. Reference signs 31 and 32 denote the width of the $TEM_{00}$-mode at one third of the maximum intensity and half maximum intensity, respectively. If the diameter of the metallic reflector layer is chosen to be at the most the width 31 of the $TEM_{00}$-mode, the light of the off-centered intensity peak of the $TEM_{10}$-mode (at about $|r|=1.75$ in the arbitrarily chosen scale of the abscissa) passes the reflector layer. Furthermore, the edge of the metallic reflector layer 15 approximately coincides with the minimum of curve 30. Thus, the fraction of the $TEM_{00}$-intensity reflected back by layer 15 is larger compared to the $TEM_{10}$-intensity. This results in a stronger damping of the $TEM_{10}$-mode.

Although it is not apparent from the intensity distributions shown in FIG. 2, the mode selectivity can be still improved by further reducing the diameter of the metallic reflector layer 15. For example, the edge of a metallic reflector layer having a diameter which matches the FWHM of $TEM_{00}$-mode (i.e. width 32) as well extends approximately along the intensity minimum of $TEM_{10}$-mode. However, the reduction of the diameter down to a width of at most the FWHM-width of the $TEM_{00}$-mode has a strong effect on the reduction of the reflectivity of other modes having a minimum at the optical axis such as the $TEM_{01}$-mode.

Figure 3:
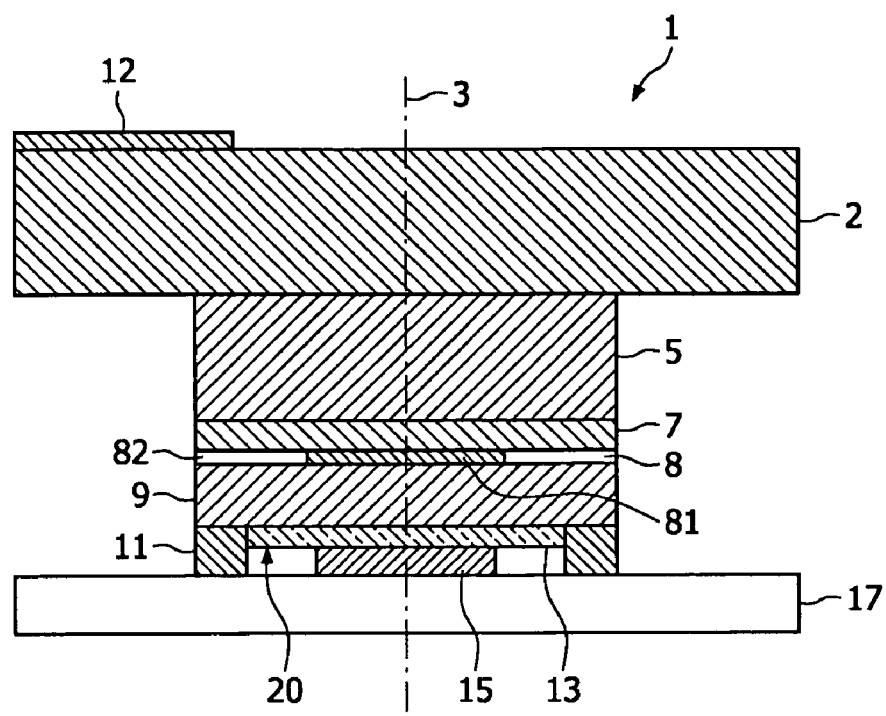
FIG. 3 shows a variant of the embodiment of FIG. 1 with a current confinement layer.

FIG. 3 shows a further embodiment of a VCSEL 1 with a localised metallic reflector layer. The VCSEL 1 comprises a confinement layer 8 adjacent to the active region 7 of the cavity. The confinement layer 8 comprises a semiconducting aperture 81 surrounded by an outer insulating region 82. Due to this structuring, the current flowing through the active region 7 is laterally confined close the centre or optical axis 3. Accordingly, the aperture 81 also laterally confines the region in which photons are emitted. The confinement layer 8 may, e.g., be produced by depositing a semiconducting layer and then locally oxidising the region 82.

The lateral dimension of the metallic reflector layer 15 is smaller than the diameter of the aperture. Thus, in this embodiment the metallic reflector layer 15 covers an area of a size which is smaller than the area occupied by the aperture 81 of confinement layer 8. Since the aperture size determines the minimum lateral dimension of the modes, this again results in a mode selectivity as elucidated with respect to FIG. 2. Typically, a metallic reflector layer smaller than the aperture 81 will also fulfil the condition that the lateral dimension of the layer is smaller than the width of the $TEM_{00}$-mode at ⅓ of the maximum intensity. Again, smaller dimensions of the metallic reflector layer improve the mode-selectivity but on the other hand result in an overall decrease of the reflectivity. It is therefore generally preferred to cover at least 1/10 of the aperture area by the metallic reflector layer.

Figure 4:
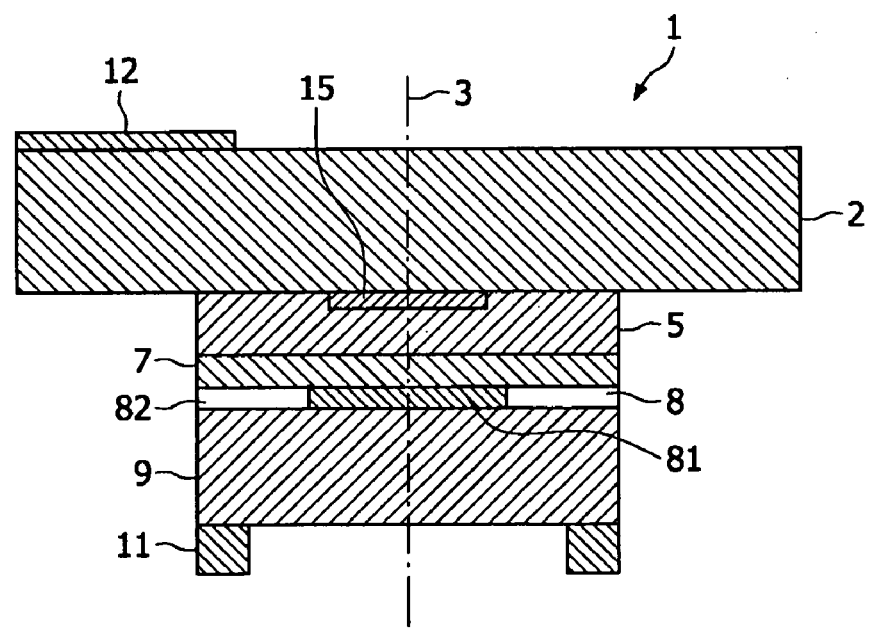
FIG. 4 depicts a top-emitting VCSEL with a laterally confined metallic reflector layer.

FIG. 4 depicts a top-emitting VCSEL with a laterally confined metallic reflector layer. In this embodiment, the light is emitted through the centre of ring contact 11. In this case, the n-type Bragg-reflector layer stack 5 is optically terminated by the metallic reflector layer 15. Analogously to the embodiments of FIGS. 1 and 3, this Bragg-reflector layer stack 5 is thinner than the other stack, comprising at most 15 GaAs/AlGaAs layer pairs. As in this case the lower Bragg-reflector layer stack is terminated by metallic reflector layer 15, this layer is buried underneath the Bragg-reflector layer stacks 5, 9 and the active region 7. If diffusion into the Bragg-reflector stack 5 is to be avoided and/or a phase matching is advantageous, a silicon oxide layer as in the embodiments of FIGS. 1 and 3 may be applied. Accordingly, this oxide layer is deposited before depositing the layers of Bragg-reflector layer stack 5. Further, similarly to the embodiment of FIG. 3, the diameter of the metallic reflector layer 15 is smaller than the diameter of aperture 81.

Figure 5:
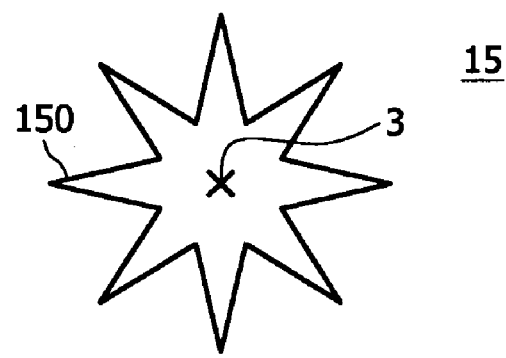
FIG. 5 shows an embodiment of a metallic reflector layer with radially varying coverage.

If a circular shaped metallic reflector layer 15 is used, the reflectivity along the radial direction drops in a step like manner at the edge of the layer. However, it is also possible to structure the layer so that the overall reflectivity drops gradually in radial direction. This can be achieved by a coverage of the metallic reflection layer decreasing gradually from the coverage at the optical axis along a direction radially outwards. An example is shown in FIG. 5. The metallic reflector layer 15 of this example is star-shaped with cantilevered tines 150. Accordingly, the coverage of ring-shaped surface elements extending about the centre of layer 15 or the optical axis 3, respectively, gradually decreases from the base of the tines 150 towards their tips.

Figure 6:
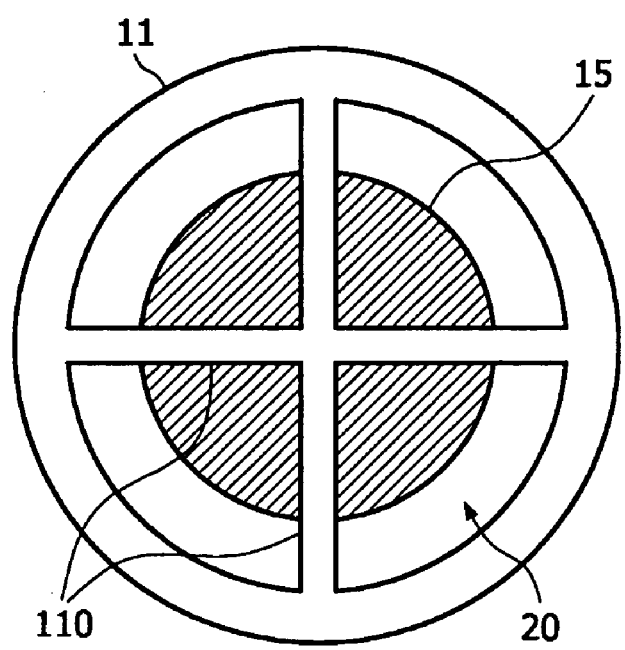
FIG. 6 depicts an arrangement of an electrical contact layer comprising sections intersecting with a metallic reflector layer.

In the embodiment as shown in FIG. 3, the current injected via ring contact 11 flows both along the and laterally towards the aperture 81. Due to the lateral component of the injection current, the current density may vary in lateral direction. In particular, the current density at the optical axis 3 may be smaller than near the edge of the aperture 81. This may also lead to a stronger gain of higher optical modes. To avoid this effect, an electrical contact layer contacting the Bragg-reflector layer stack terminated by the metallic reflector layer 15 may be employed which comprises sections intersecting the metallic reflector layer 15. An example is shown in the arrangement of FIG. 6 viewed from inside the cavity in direction along the optical axis. As in FIG. 3, the electrical contact layer is shaped as a ring contact surrounding the localised metallic reflector layer 15. The edge of metallic reflector layer 15 and the inner edge of the ring contact 11 are separated by a gap 20. However, the ring contact additionally comprises bars 110 extending diagonally across the inner circle of the ring, thereby intersecting the area covered by the metallic reflector layer 15. Suitably, these branches may extend between the upmost layer of the Bragg-reflector layer stack 9 and the insulating layer 13 in the embodiment of FIG. 3. Thus, in this case, the ring contact 11 and the metallic reflector layer 15 are not electrically connected. However, if an insulating layer can be omitted, the metallic reflector layer can also form at least a part of the respective electrical contact.

Although preferred embodiments of the present invention have been illustrated in the accompanying drawings and described in the foregoing description, it will be understood that the invention is not limited to the embodiments disclosed but is capable of numerous modifications without departing from the scope of the invention as set out in the following claims.

LIST OF REFERENCE SIGNS

1: VCSEL
2: Substrate
3: Optical axis
5: First Bragg-reflector layer stack
7: Active region
8: Confinement layer
9: Second Bragg-reflector layer stack 9
11: Ring contact
12: Bottom electrode
13: Insulating layer
15: Metallic reflector layer
17: Heat sink
20: Annular gap
29: Radial intensity distribution of $TEM_{00}$-mode
30: Radial intensity distribution of $TEM_{10}$-mode
31: Width of 29 at one third of maximum intensity
32: Width of 29 at half maximum intensity
81: Aperture of confinement layer 8
82: Insulating region of confinement layer 8
110: Bar
150: Tines

The invention claimed is:

1. A vertical cavity surface emitting laser diode, comprising
   a substrate and disposed thereon,
   a first Bragg-reflector layer stack,
   a second Bragg-reflector layer stack, said first and second Bragg-reflector layer stacks forming a laser cavity with an optical axis along which a laser beam is emitted in operation;
   a metallic reflector layer terminating one of the Bragg-reflector layer stacks, said metallic reflector layer being localised about said optical axis and covering an area no larger than an area within which the intensity of the $TEM_{00}$-laser mode exceeds more than one third of its maximum intensity.

2. The vertical cavity surface emitting laser diode according to claim 1, comprising a current confinement layer having a current aperture which laterally confines the current flowing through the laser cavity, wherein said metallic reflector layer covers an area of a size which does not exceed the size of the area covered by said aperture.

3. The vertical cavity surface emitting laser diode according to claim 2, wherein said area covered by said metallic reflector layer is at least 1/10 of the area covered by said aperture.

4. The vertical cavity surface emitting laser diode according to claim 1, wherein the metallic reflector layer is deposited onto an insulating layer.

5. The vertical cavity surface emitting layer according to claim 4, wherein said insulating layer is a silicon oxide layer.

6. The vertical cavity surface emitting laser diode according to claim 1, wherein said vertical cavity surface emitting laser diode is a bottom emitting laser diode and said metallic reflector layer is disposed on the topmost Bragg-reflector layer stack deposited on said substrate.

7. The vertical cavity surface emitting laser diode according to claim 6, in which said metallic reflection layer is circumferentially surrounded by a ring contact.

8. The vertical cavity surface emitting laser diode according to claim 1, in which the real part of refractive index of said metallic reflector layer is lower than 0.5.

9. The vertical cavity surface emitting laser diode according to claim 1, wherein the material of said metallic reflection layer is selected from the group consisting of gold, silver, copper, and alloys thereof.

10. The vertical cavity surface emitting laser diode according to claim 1, wherein the coverage by said metallic reflection layer decreases gradually from the coverage at the optical axis along a direction radially outwards.

11. The vertical cavity surface emitting laser diode according to claim 1, in which said metallic reflector layer forms at least a part of one of the electrical contacts.

12. The vertical cavity surface emitting laser diode according to claim 1, wherein said vertical cavity surface emitting laser diode is a top emitting laser diode and said metallic reflector layer is buried underneath said first and second Bragg-reflector layer stacks.

13. The vertical cavity surface emitting laser diode according to claim 1, wherein the Bragg-reflector layer stack terminated by said metallic reflector layer comprises at most 15 pairs of layers with alternating higher and lower refractive index.

14. The vertical cavity surface emitting laser diode according to claim 1, further comprising an electrical contact layer contacting the Bragg-reflector layer stack terminated by said metallic reflector layer and comprising sections intersecting said metallic reflector layer.

* * * * *